(12) United States Patent
Ramos et al.

(10) Patent No.: US 12,240,239 B2
(45) Date of Patent: Mar. 4, 2025

(54) MICROFLUIDIC PASSAGE WITH PROTECTIVE LAYER

(71) Applicant: Hewlett-Packard Development Company, L.P., Spring, TX (US)

(72) Inventors: Juan Carlos Ramos, Corvallis, OR (US); Stefan Enrique Lucchini, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 202 days.

(21) Appl. No.: 18/008,961

(22) PCT Filed: Jun. 12, 2020

(86) PCT No.: PCT/US2020/037368
§ 371 (c)(1),
(2) Date: Dec. 7, 2022

(87) PCT Pub. No.: WO2021/251979
PCT Pub. Date: Dec. 16, 2021

(65) Prior Publication Data
US 2023/0241889 A1     Aug. 3, 2023

(51) Int. Cl.
*B41J 2/16* (2006.01)
*B41J 2/14* (2006.01)
*B81B 7/00* (2006.01)

(52) U.S. Cl.
CPC ........ *B41J 2/14129* (2013.01); *B41J 2/1601* (2013.01); *B41J 2/164* (2013.01); *B81B 7/0025* (2013.01); *B81B 2203/0338* (2013.01)

(58) Field of Classification Search
CPC ............................ B41J 2/1601; B81B 7/0025
See application file for complete search history.

(56) References Cited

U.S. PATENT DOCUMENTS

| | | |
|---|---|---|
| 9,511,585 B2 | 12/2016 | Abbott, Jr. et al. |
| 2002/0033750 A1 | 3/2002 | Oizumi et al. |
| 2010/0086397 A1 | 4/2010 | Varanasi et al. |
| 2013/0063525 A1 | 3/2013 | Sieber |
| 2016/0017340 A1 | 1/2016 | Wu et al. |
| 2019/0001679 A1 | 1/2019 | Aoki et al. |

FOREIGN PATENT DOCUMENTS

| | | | | |
|---|---|---|---|---|
| CN | 204820670 U | * | 12/2015 | ......... B05B 17/0607 |
| JP | 2001-219589 A | | 8/2001 | |
| WO | WO-2020222768 A1 | * | 11/2020 | .......... B41J 2/14072 |

* cited by examiner

*Primary Examiner* — Sharon Polk
(74) *Attorney, Agent, or Firm* — Foley & Lardner LLP

(57) ABSTRACT

A microfluidic die may include a microfluidic passage and a protective layer provided adjacent to internal surfaces of the microfluidic passage. The protective layer may include a protective nano-crystalline material and a protective amorphous matrix encapsulating the protective nano-crystalline material.

20 Claims, 6 Drawing Sheets

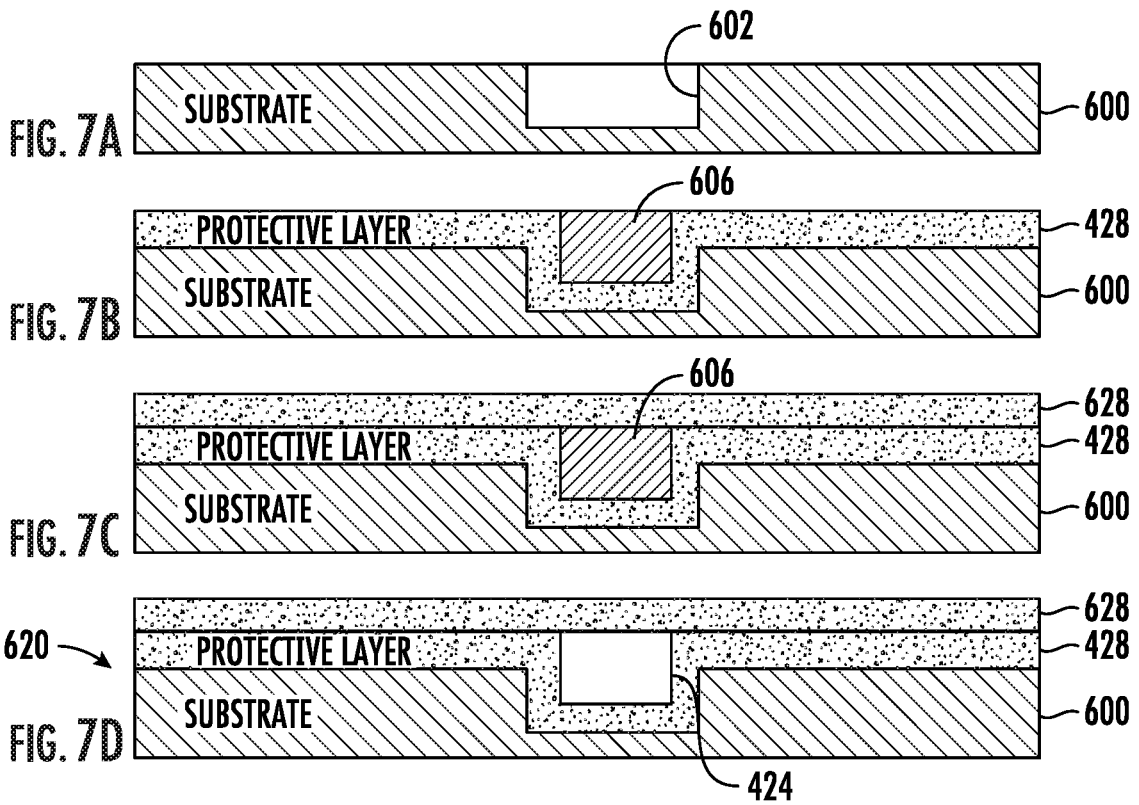
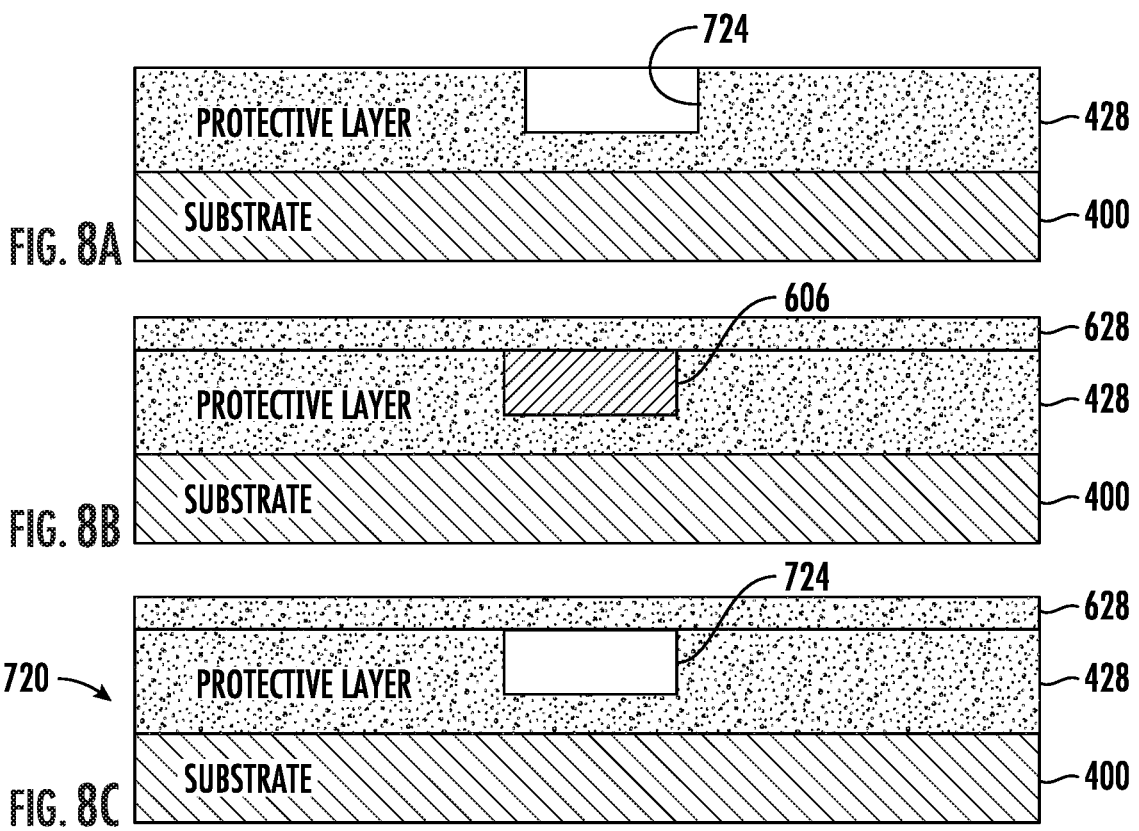

MICROFLUIDIC PASSAGE WITH PROTECTIVE LAYER

CROSS REFERENCE TO RELATED APPLICATIONS

This application is a National Stage Application of PCT Application No. PCT/US2020/037368, filed Jun. 12, 2020, which is hereby incorporated by reference in its entirety.

BACKGROUND

Microfluidic dies are used in a wide variety of applications. Some microfluidic dies, such as those used in media printing and 3D printing, eject fluid. Some microfluidic dies are used for bioscience, for environmental testing or for other chemical analysis.

BRIEF DESCRIPTION OF THE DRAWINGS

FIGS. 7A, 7B, 7C and 7D are sectional views illustrating an example method for forming an example microfluidic die.

FIGS. 8A, 8B and 8C are sectional views illustrating an example method for forming an example microfluidic die.

Figure 1:
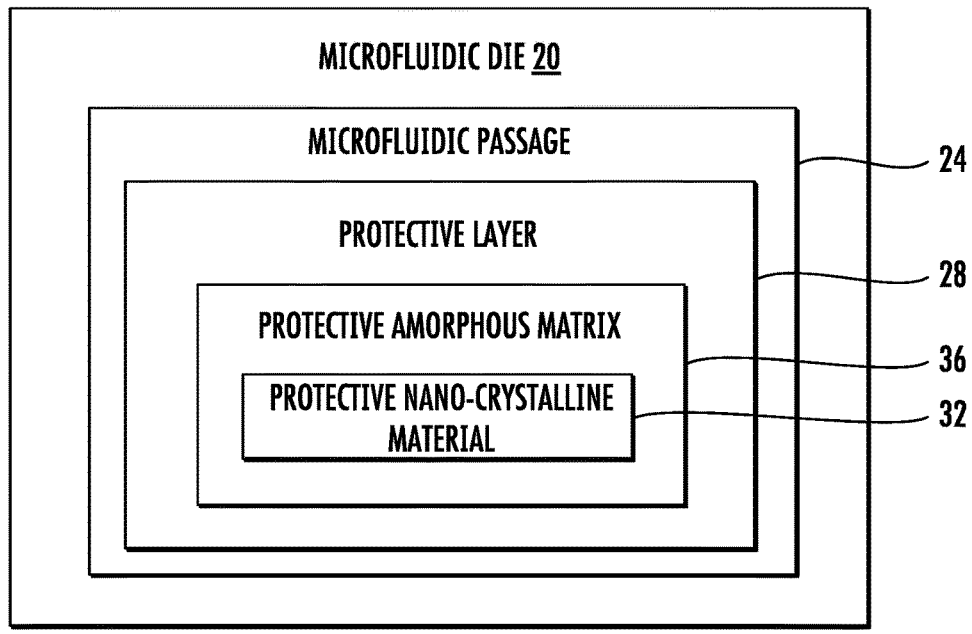
FIG. 1 is a block diagram illustrating portions of an example microfluidic die.

Throughout the drawings, identical reference numbers designate similar, but not necessarily identical, elements. The FIGS. are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION OF EXAMPLES

Disclosed are example microfluidic dies and example methods for forming example microfluidic dies. Microfluidic dies direct fluid to or through microfluidic passages. A microfluidic passage may be any volume in which fluid is stored or through which fluid is directed. The fluid may negatively interact with the surfaces of the microfluidic passages. For example, the surfaces of the microfluidic passages may be vulnerable to erosion and heat damage. The microfluidic passages of fluid ejection dies may additionally be vulnerable to kogation. The disclosed example microfluidic dies and example methods for forming the example microfluidic dies address such vulnerabilities by using a protective layer which comprises a protective nanocrystalline material encapsulated within a protective amorphous matrix.

The protective nano-crystalline material may be selected from a group of materials consisting of Titanium Carbon Nitride (TiCN), Tantalum Carbon Nitride (TaCN), Niobium Carbon Nitride (NbCN), Titanium Boron Nitride (TiBN), Tantalum Boron Nitride (TaBN), Niobium Boron Nitride (NbCN), Titanium Tantalum Carbon Nitride, Titanium Tantalum Boron Nitride, Titanium Niobium Carbon Nitride, Titanium Niobium Boron Nitride, Tantalum Niobium Carbon Nitride and Tantalum Niobium Boron Nitride. The protective amorphous matrix encapsulating the protective nanocrystalline material may comprise silicon carbon (SiC) or silicon boron (SiB).

The disclosed compositions of the protective layer may be stable at high temperatures, such as temperatures greater than 500° C., and in some implementations, at temperatures greater than 700° C. As a result, the example protective layers may be well suited for use in microfluidic dies where the fluid may be at high temperatures. For example, the example protective layers may be well suited for protecting those surfaces of a microfluidic passage that are proximate to a thermal resistor. The example protective layers may be especially well suited for protecting those surfaces of a microfluidic passage that are proximate to a thermal resistor used as part of an inertial pump or used as part of a fluid ejector.

The disclosed compositions of the protective layer are also well-suited for forming a smooth thin film, a layer having a thickness of no greater than 1 μm with an average surface roughness of no greater than 10 nm. The disclosed compositions of the protective layer may form a smooth thin film having a thickness of no greater than 500 nm with an average surface roughness of no greater than 5 nm. In some implementations, the disclosed compositions of the protective layer may form a smooth thin film having a thickness of no greater than 1 μm and a peak roughness of no greater than 10 nm and, in some implementations, no greater than 5 nm. For purposes of the disclosure, "average roughness" refers to an average of the vertical distances separating the peaks and the valleys along the surface. For purposes of this disclosure, "peak roughness" refers to the vertical distance between the tallest height and the deepest depth found along the surface.

The discovery that the disclosed compositions may be used to form such an extremely thin layer while also achieving such high degrees of smoothness offers great benefits in the field of microfluidic devices where the scale of such microfluidic devices may present many challenges. With many microfluidic devices, thicker protective layers may not be an option. Moreover, rougher protective layers may be subject to particle accumulation along the microfluidic passage, within the crevices or recesses of the protective layer. When used in fluid ejection dies, the rougher protective layers may produce uneven heat conduction which may lead to inconsistent fluid ejection.

The disclosed compositions of the protective layer are also well-suited for being selectively patterned. For example, the disclosed compositions for the protective layer may be applied with a masking process and may be selectively removed with a material removal process, such as etching. The ability to pattern and selectively form the protective layer further facilitates use of the disclosed protective layers in microfluidic dies.

The disclosed microfluidic dies may comprise a platform or substrate formed by a single layer or multiple layers that support or form microfluidic passages, chambers and volumes and that further support electronic elements in the form of transistors, resistors, fluid actuators and their associated electrical conductive wires or traces. The platform or substrate may comprise a silicon-based wafer or other such similar materials used for microfabricated devices (e.g., glass, gallium arsenide, quartz, sapphire, metal, plastics, etc.). In some implementations, the microfluidic die may be in the form of a microfluidic chip and may have portions formed from a glass reinforced epoxy laminate material such as a glass epoxy laminate such as FR4, wherein microfluidic channels may be formed in the laminate material or may be formed in other structures mounted to the laminate material.

As will be appreciated, portions of the disclosed microfluidic dies may be formed by performing various microfabrication and/or micromachining processes on a substrate to form and/or connect structures and/or components. Microfluidic channels and/or chambers may be formed by performing etching, microfabrication processes (e.g., photolithography), or micromachining processes in a substrate. Accordingly, microfluidic channels and/or chambers may be defined by surfaces fabricated in the substrate of a microfluidic device. In some implementations, microfluidic channels and/or chambers may be formed by an overall package, wherein multiple connected package components combine to form or define the microfluidic channel and/or chamber.

In some examples described herein, a dimension or multiple dimensions of a microfluidic channel, passage and/or capillary chamber may be of sufficiently small size (e.g., of nanometer sized scale, micrometer sized scale, millimeter sized scale, etc.) to facilitate pumping of small volumes of fluid (e.g., picoliter scale, nanoliter scale, microliter scale, milliliter scale, etc.). For example, some microfluidic channels or passages may facilitate capillary pumping due to capillary force. In addition, examples may couple two or more microfluidic channels or passages to a microfluidic output channel via a fluid junction.

Disclosed are example microfluidic dies. The example microfluidic dies may comprise a microfluidic passage and a protective layer provided adjacent to internal surfaces of the microfluidic passage. The protective layer may comprise a protective nano-crystalline material and a protective amorphous matrix encapsulating the protective nano-crystalline material.

Disclosed are example methods for forming a microfluidic die. The example methods may comprise providing a microfluidic die having a microfluidic passage and coating the passage with a protective layer. The protective layer may comprise a protective nano-crystalline material and a protective amorphous matrix encapsulating the protective nanocrystalline material. In some implementations, selected portions of the protective layer may be removed.

Disclosed are example methods for forming a microfluidic die. The methods may comprise providing a substrate, forming a protective layer upon the substrate, and forming a microfluidic passage forming layer on the substrate to form the microfluidic passage along the protective layer. The protective layer may comprise a protective nano-crystalline material and a protective amorphous matrix encapsulating the protective nano-crystalline material.

Disclosed are example methods for forming a microfluidic die. The methods may comprise providing a substrate, forming a thermal resistor on the substrate, forming a protective layer upon the substrate and upon the thermal resistor and forming a microfluidic passage forming layer on the substrate to form a microfluidic passage along the protective layer. The protective layer may comprise a protective nano-crystalline material and a protective amorphous matrix encapsulating the protective nano-crystalline material.

Disclosed are example methods for forming microfluidic die. The methods may comprise providing a substrate, forming a thermal resistor on the substrate, forming a protective layer upon the substrate and upon the thermal resistor, forming a microfluidic passage forming layer on the substrate to form a microfluidic passage along the protective layer and forming an ejection orifice layer on the microfluidic passage forming layer. The protective layer may comprise a protective nano-crystalline material and a protective amorphous matrix encapsulating the protective nano-crystalline material.

Disclosed are example fluid ejection dies. The example fluid ejection dies may comprise a substrate, a thermal resistor supported by the substrate and a fluid passage forming layer supported by the substrate to form a microfluidic passage opposite the thermal resistor. Example dies may further comprise a protective layer supported by the substrate between the fluid passage and the thermal resistor. The protective layer may comprise a thin film having a thickness of no greater than 1 μm and a roughness of no greater than 10 μm. The protective layer may comprise a protective nanocrystalline material encapsulated within a protective amorphous matrix.

FIG. 1 is a block diagram of an example microfluidic die 20. Microfluidic die 20 comprises microfluidic passage 24 and protective layer 28. Microfluidic passage 24 comprises an internal volume formed by internal surfaces of microfluidic die 20. Microfluidic passage has a dimension or multiple dimensions of sufficiently small size (e.g., of nanometer sized scale, micrometer sized scale, millimeter sized scale, etc.) to facilitate the containment of or the pumping of small volumes of fluid (e.g., picoliter scale, nanoliter scale, microliter scale, milliliter scale, etc.)

Protective layer 28 coats internal surfaces of the microfluidic passage 24. Protective layer 28 comprises protective nano-crystalline material 32 encapsulated within protective amorphous matrix 36. The protective nano-crystalline material 32 may be selected from a group of materials consisting of Titanium Carbon Nitride (TiCN), Tantalum Carbon Nitride (TaCN), Niobium Carbon Nitride (NbCN), Titanium Boron Nitride (TiBN), Tantalum Boron Nitride (TaBN), Niobium Boron Nitride (NbCN), Titanium Tantalum Carbon Nitride, Titanium Tantalum Boron Nitride, titanium Niobium Carbon Nitride, Titanium Niobium Boron Nitride, Tantalum Niobium Carbon Nitride and Tantalum Niobium Boron Nitride. The protective amorphous matrix 36 encapsulating the protective nano-crystalline material 32 may comprise silicon carbon (SiC) or silicon boron (SiB).

The compositions of the protective layer 28 may be stable at high temperatures, such as temperatures greater than 500° C., and in some implementations, at temperatures greater than 700° C. As a result, the example protective layer 28 may be well suited for use in microfluidic dies where the fluid within microfluidic passage 24 may be at high temperatures. For example, the example protective layer 28 may be well suited for protecting those surfaces of a microfluidic passage 24 that are proximate to a thermal resistor. The example protective layer 28 may be especially well suited for protecting those surfaces of microfluidic passage 24 that are proximate to a thermal resistor used as part of an inertial pump or used as part of a fluid ejector.

In some implementations, the example protective layer 28 comprises a smooth thin film, a layer having a thickness of no greater than 1 μm with an average surface roughness of no greater than 10 nm. In some implementations, the protective layer 28 may form a smooth thin film having a thickness of no greater than 500 nm with an average surface roughness of no greater than 5 nm. In some implementations, the disclosed compositions of the protective layer 28 may form a smooth thin film having a thickness of no greater than 1 μm and a peak roughness of no greater than 10 nm and, in some implementations, no greater than 5 nm. In such implementations, protective layer 28 facilitates a smaller scale for microfluidic die 20. In such implementations, because protective layer 28 is relatively smooth, protective layer 28 is less vulnerable to particle accumulation along the interior side walls or surfaces of microfluidic passage 24. Moreover, the low degree of roughness of protective layer 28 may achieve more uniform heat conduction. In implementations where protective layer 28 is utilized in a microfluidic die 20 that comprises a fluid ejection device, the more uniform heat conduction may result in more consistent ejection of fluid.

In some implementations, protective layer 28 surrounds microfluidic passage 24. In some implementations, protective layer partially covers those surfaces that extend about microfluidic passage 24. In some implementations, protective layer 28 is selectively patterned onto internal surfaces that form microfluidic passage 24. For example, in some implementations, protective layer 28 is patterned using a masking process. In some implementations, protective layer 28 is initially applied, followed by portions of protective layer 28 being selectively removed with a material removal process. For example, in some implementations, selected ports of protective layer 28 may be etched.

Figure 2:
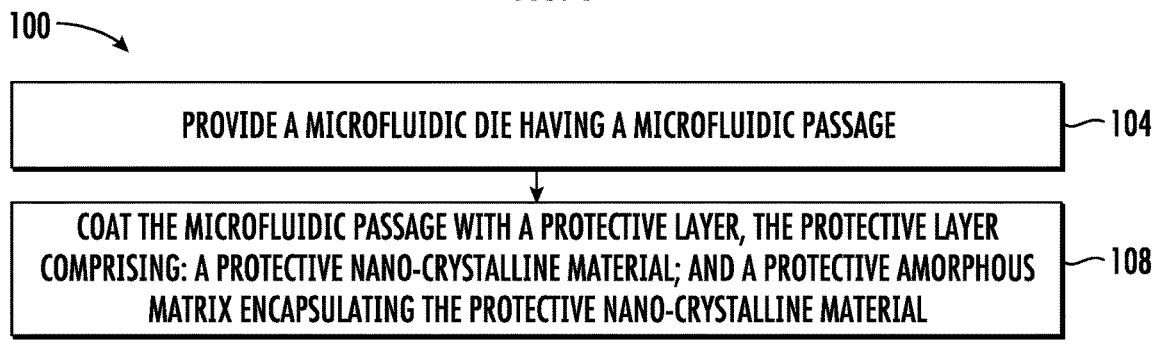
FIG. 2 is a flow diagram of an example method for forming an example microfluidic die.

FIG. 2 is a flow diagram of an example method 100 for forming an example microfluidic die, such as microfluidic die 20 described above. As indicated by block 104, a microfluidic die having a microfluidic passage is provided. In some implementations, the microfluidic die and the microfluidic passage may be similar to microfluidic die 20 and microfluidic passage 24, respectively, described above. As indicated by block 108, the microfluidic passage is coated with a protective layer 28. As described above, protective layer 28 comprises a protective nanocrystalline material encapsulated within a protective amorphous matrix.

Figure 3:
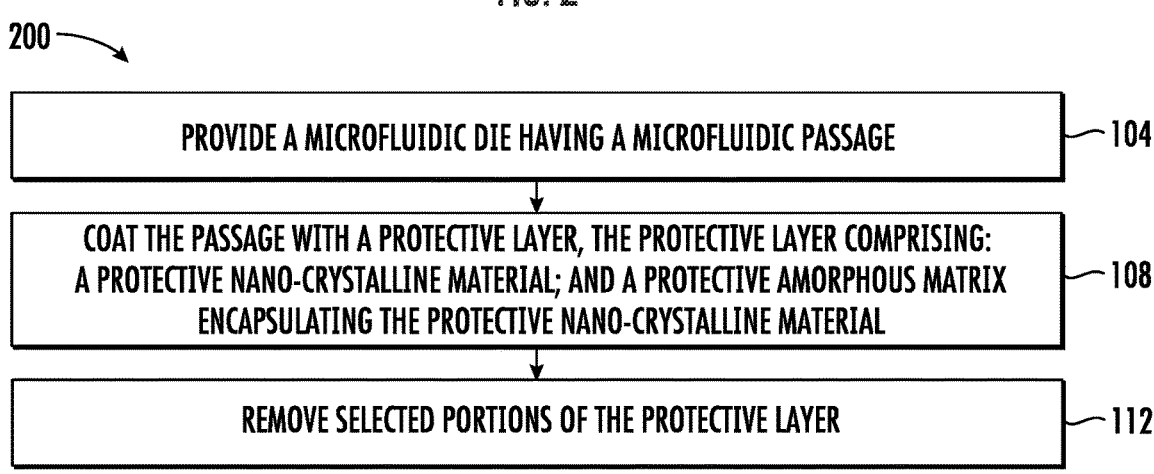
FIG. 3 is a flow diagram of an example method for forming an example microfluidic die.

FIG. 3 is a flow diagram of an example method 200 for forming an example microfluidic die, such as microfluidic die 20 described above. FIG. 3 illustrates one example of how the protective layer 28 may be formed on selected portions of a microfluidic passage. Method 200 is similar to method 100 except that method 200 additionally comprises block 112. As indicated by block 112, selected portions of the previously applied protective layer 28 are removed. In some implementations, such removal is through chemical etching. In other implementations, selected portions of the previously applied protective layer 28 may be removed with other material removal techniques.

Figure 4:
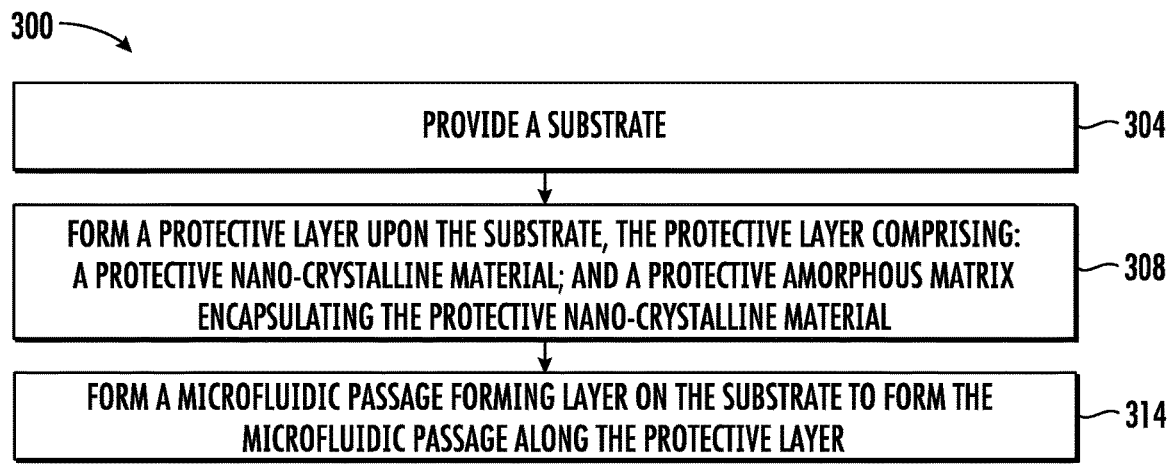
FIG. 4 is a flow diagram of an example method for forming an example microfluidic die.
Figure 5A:
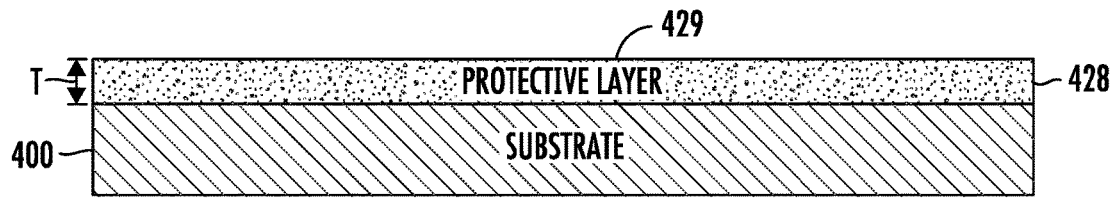
FIGS. 5A and 5B are sectional views illustrating an example method for forming an example microfluidic die.
Figure 5B:
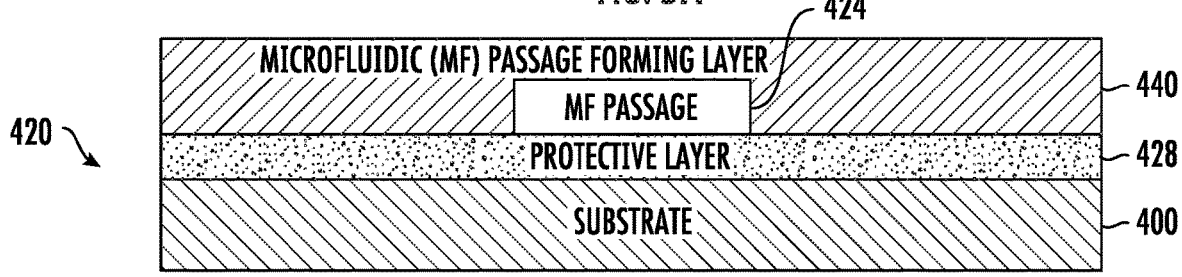

FIG. 4 is a flow diagram of an example method 300 for forming an example microfluidic die, such as microfluidic die 20 described above. FIGS. 5A and 5B are sectional views illustrating method 300. FIGS. 4, 5A and 5B illustrate an example of how protective layer 28 may be provided adjacent to internal surfaces of a microfluidic passage of a microfluidic die.

As indicated by block 304 and shown in FIG. 5A, a substrate 400 is provided. The substrate is formed of a material that may serve as a platform for the microfluidic die 420 shown in FIG. 5B. In some implementations, substrate 400 may be formed from a material that may be vulnerable or susceptible to damage from interaction with the fluid being contained within the microfluidic passage 424 of microfluidic die 420. For example, substrate 400 may be formed from a material that is vulnerable to erosion, heat damage and/or kogation when part of microfluidic die 420. In some implementations, substrate 400 is formed from silicon. In other implementations, substrate 400 may be formed from other materials.

As indicated by block 308 and further shown by FIG. 5A, protective layer 428 is formed upon substrate 400. Protective layer 428 has a composition similar to protective layer 28 described above. In some implementations, protective layer 428 may be deposited upon substrate 400 by DC-Pulsed PACVD (Plasma-assisted Chemical Vapor Deposition). In some implementations, protective layer 428 is formed as a thin film having a thickness T of no greater than 1 μm, and in some implementations, no greater than 500 nm. In some implementations, protective layer 428 has a surface 429 with an average roughness of no greater than 10 nm and, in some implementations, no greater than 5 nm. In some implementations, protective layer 428 may have a peak roughness value of no greater than 10 nm and, in some implementations, no greater than 5 nm.

As indicated by block 314, and as shown by FIG. 5B, a microfluidic passage forming layer 440 is formed on a substrate 400 to form microfluidic passage 424 along protective layer 428. In the example illustrated, microfluidic passage forming layer 440 is formed indirectly upon substrate 400, directly upon protective layer 428. In other implementations, layer 440 may be directly formed upon substrate 400. In some implementations, microfluidic passage forming layer 440 is patterned during its deposition to form microfluidic passage 424.

In some implementations, microfluidic passage forming layer 440 may be formed from a material that is less vulnerable to erosion, heat damage and/or kogation as compared to the material of substrate 400. In some implementations, microfluidic passage forming layer 440 may be formed using photo imaging techniques involving masking, etching and the like. In some implementations, microfluidic passage forming layer 440 may be formed from a photo-imageable epoxy, such as SUB. In other implementations, microfluidic passage forming layer 440 may be formed using other methods and from other materials.

Figure 6A:
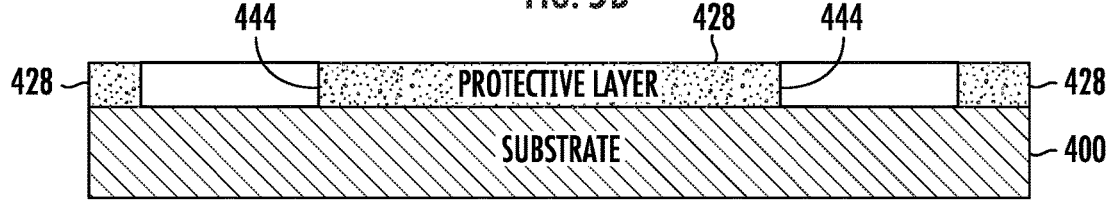
FIGS. 6A and 6B are sectional views illustrating an example method for forming an example microfluidic die.
Figure 6B:
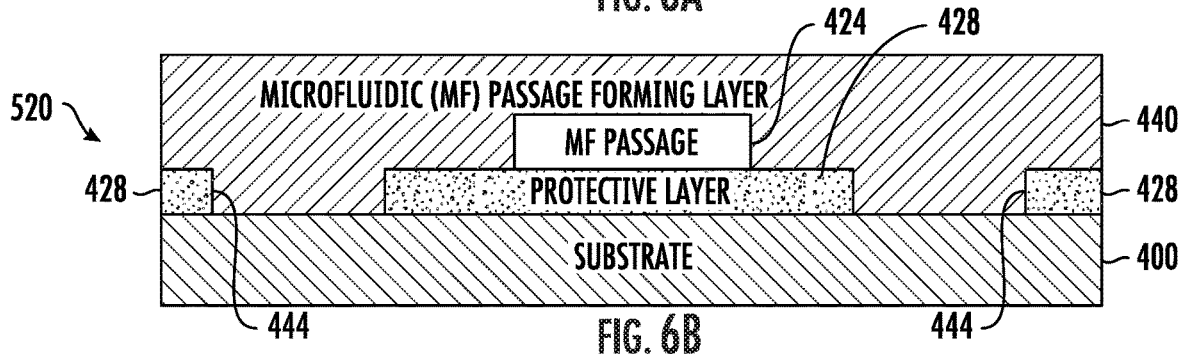
Figure 9:
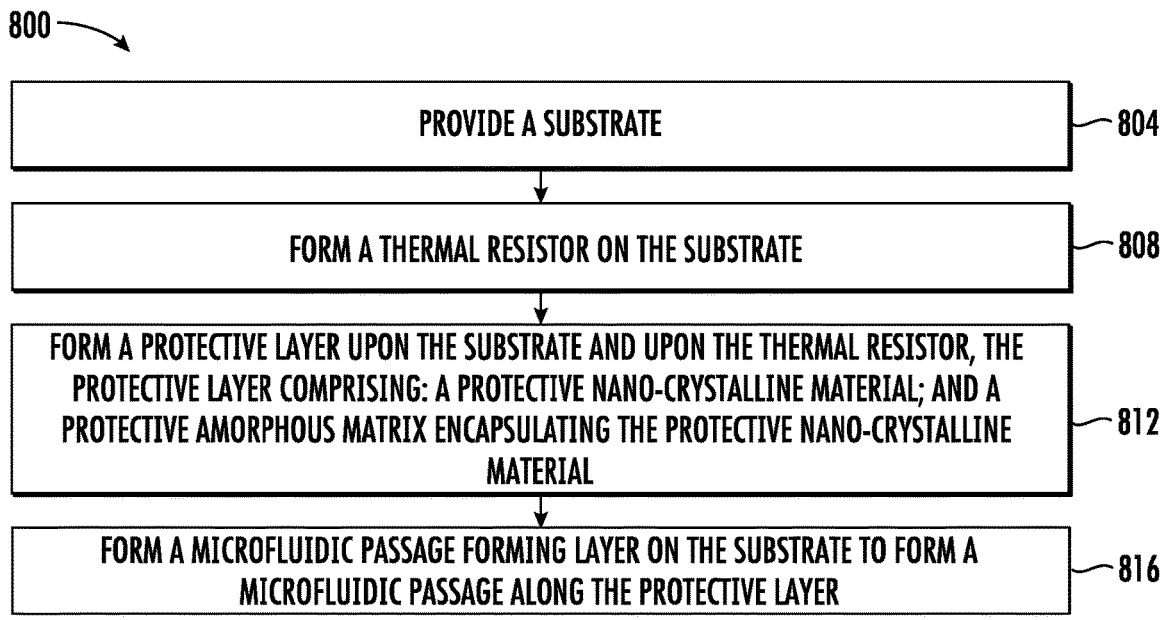
FIG. 9 is a flow diagram of an example method for forming an example microfluidic die.

FIGS. 6A and 6B are sectional views illustrating another example implementation of method 300. FIGS. 6A and 6B illustrate how protective layer 428 may be selectively formed on selected portions of substrate 400 such that the microfluidic passage forming layer 440 may have portions directly deposited upon substrate 400. As shown in FIG. 6A, protective layer 428 is patterned upon substrate 400. In some implementations, protective layer 428 is initially blanket coated on substrate 400, wherein openings 444 are formed within protective layer 428 by removing portions of protective layer 428. For example, portions of protective layer 428 may be removed with chemical etching. In some implementations, protective layer 428 is selectively patterned on substrate 400 using a masking technique.

As shown in FIG. 6B, microfluidic passage forming layer 440 is formed on protective layer 428 to form microfluidic die 520. Microfluidic passage forming layer 440 further extends through openings 444 into direct contact with substrate 400. As a result, microfluidic passage forming layer 440 extends within openings 444 and along sides of protective layer 428 to be securely joined to substrate 400 to further retain protective layer 428.

FIGS. 7A-7D are sectional views illustrating an example method for forming an example microfluidic die. FIGS. 7A-7D illustrate an example of how protective layer 428 may be formed to surround microfluidic passage 424 (shown in FIG. 7D). As shown by FIG. 7A, a substrate 600 having a recess 602 is provided. Substrate 600 may be similar to substrate 400 described above except for the provision of recess 602. Recess 602 may be formed in substrate 600 through a material removal process, such as chemical etching. In some implementations, recess 602 may be formed by molding substrate 600 or depositing substrate 600 with a masking procedure.

As shown by FIG. 7B, protective layer 428 is formed upon substrate 600, lining the interior surfaces of recess 602. In some implementations, protective layer 428 is deposited upon substrate 600 using DC-Pulsed PACVD. Those empty portions of recess 602 form microfluidic passage 424. As further shown by FIG. 7B, microfluidic passage 424 is filled with a sacrificial material 606. In some implementations, sacrificial material 606 may comprise wax. In other implementations, sacrificial material 606 may comprise other materials that may be subsequently removed without substantial modification of protective layer 428.

As shown by FIG. 7C, protective layer 628 is formed on protective layer 428 and over sacrificial material 606. Protective layer 628 may have the same composition as protective layer 428. Protective layer 628 may be formed upon protective layer 428 by DC-Pulsed PACVD. In some implementations, protective layer 628 may be formed on selected portions of protective layer 428, such as with masking and/or material removal.

As shown by FIG. 7D, sacrificial material 606 is removed or sacrificed, resulting in microfluidic die 620 with microfluidic passage 424 being surrounded by portions of protective layers 428 and 628. Thereafter, additional layers may be formed upon protective layer 628. In some implementations, the additional layers may extend through openings formed in protective layers 428 and 628, such that the additional layers may be joined to substrate 600.

FIGS. 8A-8C are sectional views illustrating an example method for forming an example microfluidic die. FIGS. 8A-8C illustrate an example of how a microfluidic passage 724 may be formed within the protective layer and completely surrounded by protective layers. As shown by FIG. 8A, protective layer 428 is formed on substrate 400. Microfluidic passage 724 is further formed within protective layer 428. In some implementations, portions of protective layer 428 are removed with a material removal process, such as etching, to form microfluidic passage 724. In other implementations, microfluidic passage 724 may be formed by molding or selectively applying the materials of protective layer 428 upon substrate 400.

As shown by FIG. 8B, microfluidic passage 724 is filled with sacrificial material 606 and protective layer 628 is formed upon protective layer 428 and over sacrificial material 606. Protective layer 628 may be formed upon protective layer 428 by DC-Pulsed PACVD. In some implementations, protective layer 628 may be formed on selected portions of protective layer 428, such as with masking and/or material removal.

As shown by FIG. 8C, sacrificial material 606 is removed or sacrificed, resulting in microfluidic die 720 with microfluidic passage 724 being surrounded by portions of protective layers 428 and 628. Thereafter, additional layers may be formed upon protective layer 628. In some implementations, the additional layers may extend through openings formed in protective layers 428 and 628, such that the additional layers may be joined to substrate 400.

Figure 10A:
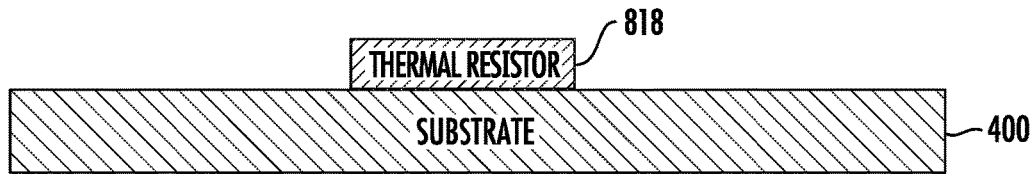
FIGS. 10A, 10B and 10C are sectional views illustrating an example method for forming an example microfluidic die.
Figure 10B:
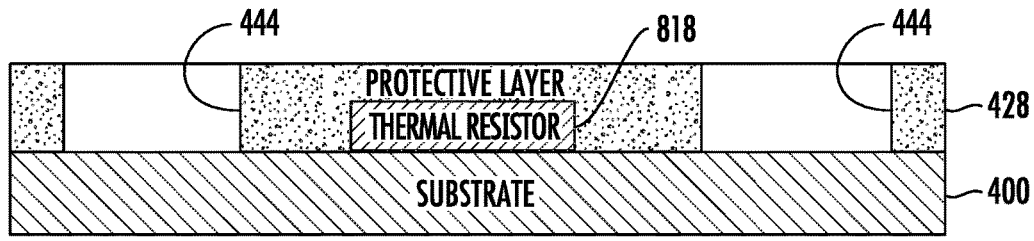
Figure 10C:
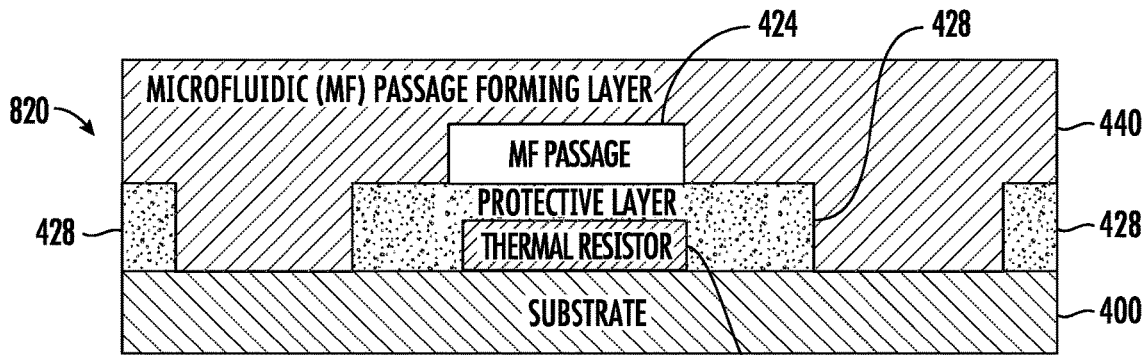

FIG. 9 and FIGS. 10A-10C illustrate an example method 800 for forming a microfluidic die 820 (shown in FIG. 10C). Such Figures illustrate an example of how protective layer 428 may be formed to protect an internal surface of a microfluidic passage that is proximate a thermal resistor. As indicated by block 804 and shown in FIG. 10A, substrate 400 is provided.

As indicated by block 808 and shown in FIG. 10A, thermal resistor 818 is formed on substrate 400. Thermal resistor 818 may be formed by sputtering or other deposition techniques followed by material removal such as with etching. In some implementations masking may be employed to pattern thermal resistor 818 on substrate 400. Thermal resistor 818 comprises an electrically conductive material, such as aluminum or the like, which is to be electrically connected to a controlled electrical power source, wherein the transmission of electrical current across thermal resistor 818, results in thermal resistor 818 emitting heat. In some implementations, the controlled electrical power source and thermal resistor 818 output heat that may exceed 500° C. and, in some implementations, may exceed 700° C.

As indicated by block 812, and as shown by FIG. 10B, protective layer 428 is formed on substrate 400. Protective layer 428 is further formed around and over thermal resistor 818, covering thermal resistor 818. As described above with respect to FIG. 6A, openings 444 are formed within protective layer 428.

As indicated by block 816 and as shown in FIG. 10C, microfluidic passage forming layer 440 is formed on protective layer 428 to form microfluidic die 820. Protective layer 428 is sandwiched between thermal resistor 818 and microfluidic passage 424. Microfluidic passage forming layer 440 further extends through openings 444 into direct contact with substrate 400. As a result, microfluidic passage forming layer 440 extends within openings 444 and along sides of protective layer 428 to be securely joined to substrate 400 to further retain protective layer 428. In some implementations, the resistor 818 is located along microfluidic passage 424 so as form part of an inertial pump, wherein heat from thermal resistor 818 is sufficient to nucleate fluid within microfluidic passage 424, creating a bubble that expands and subsequently collapses to displace fluid along microfluidic passage 424.

Figure 11:
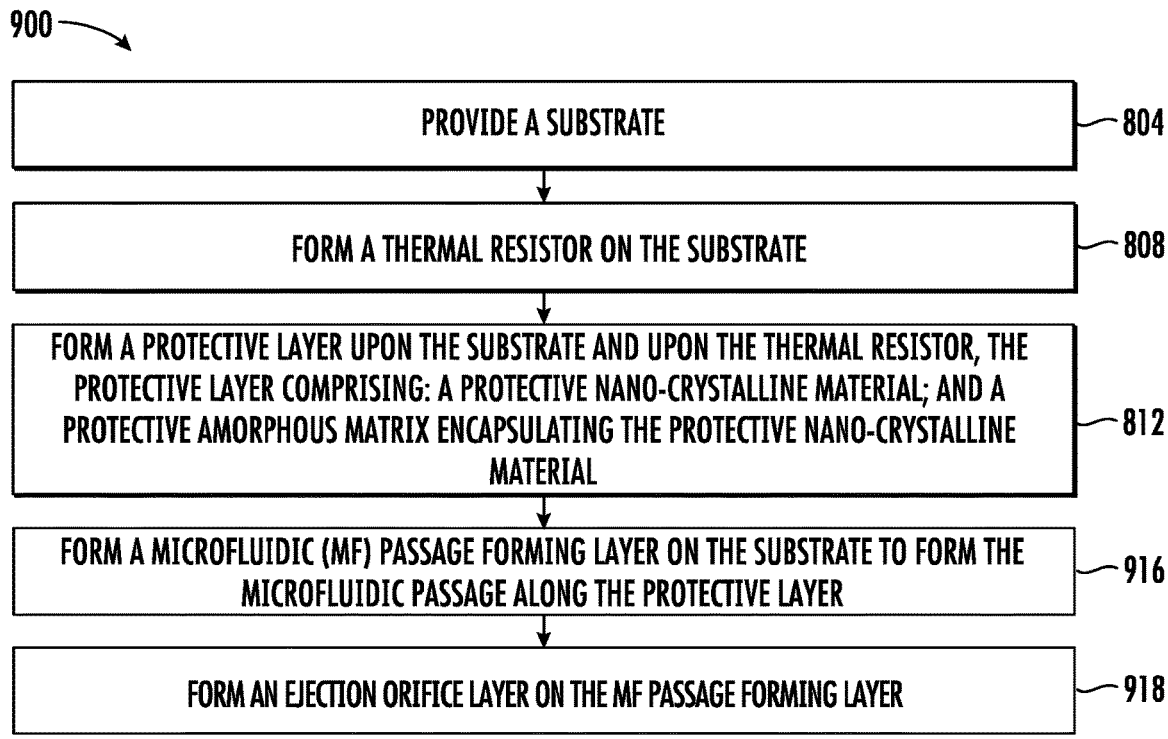
FIG. 11 is a flow diagram of an example method for forming an example microfluidic die.
Figure 12A:
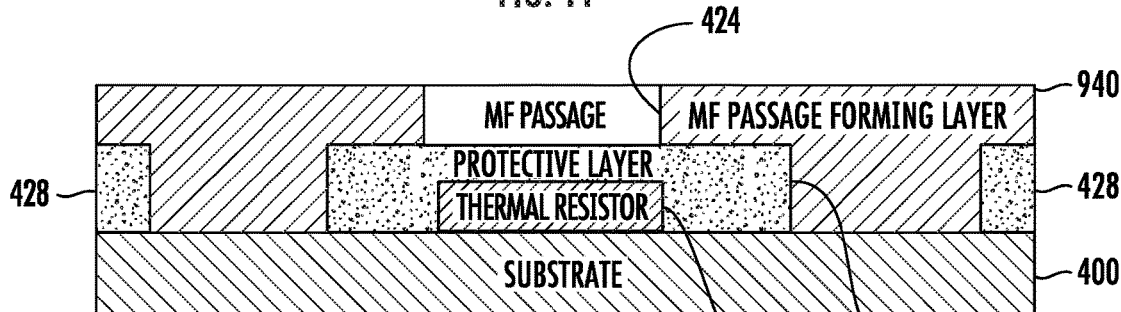
FIGS. 12A and 12B are sectional views illustrating an example method for forming an example microfluidic die.
Figure 12B:
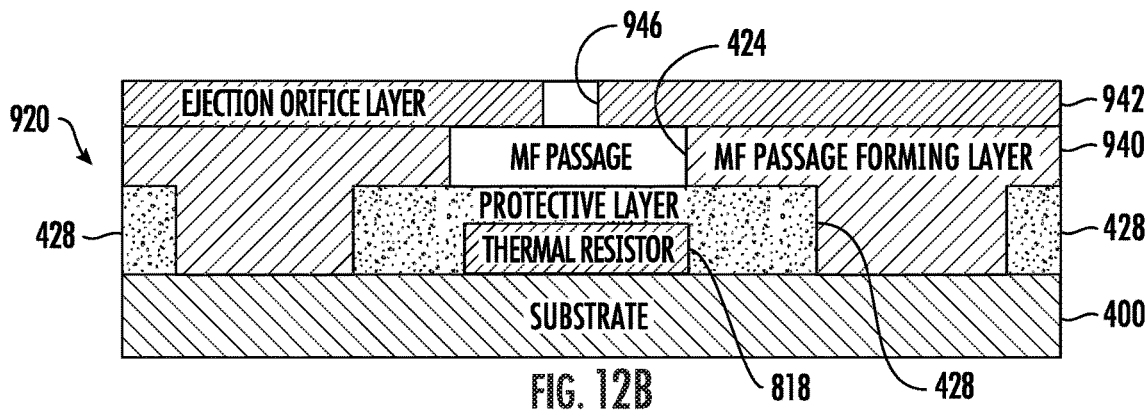

FIG. 11 and FIGS. 12A and 12B illustrate an example method 900 for forming an example microfluidic die 920 (shown in FIG. 12B) which serves as a fluid ejection device. Such Figures illustrate an example of how protective layer 428 may be utilized as part of such a fluid ejection device. Method 900 is similar to method 800 described above except that method 900 forms microfluidic passage forming layer 940 instead of microfluidic forming layer 440 and additionally forms ejection orifice layer 942. Those remaining portions of method 900 which correspond to portions of method 800 are numbered similarly.

As indicated by block 916 and as shown in FIG. 12A, microfluidic passage forming layer 940 is formed on substrate 400 and protective layer 428. Microfluidic passage forming layer 940 is similar to microfluidic passage forming layer 440 described above except that microfluidic forming passage forming layer 940 is open opposite to microfluidic passage 424 to expose microfluidic passage 424. Microfluidic passage 424 may serve as a fluid ejection chamber which contains fluid being displaced during a fluid ejection.

As indicated by block 918 and as shown in FIG. 12B, ejection orifice layer 942 is formed over or on the microfluidic passage forming layer 940. Ejection orifice layer 942 comprises an ejection orifice 946 through which fluid drops are ejected upon electrical actuation of thermal resistor 818. In some implementations, ejection orifice layer 942 is initially applied over microfluidic passage forming layer 940, wherein material removal techniques are subsequently applied form ejection orifice 946. In yet other implementations, ejection orifice layer 942 is patterned during his deposition to form ejection orifice 946. In some implementations, ejection orifice layer 942 is preformed with ejection orifice 946 and is laminated to microfluidic passage forming layer 940.

In some implementations, ejection orifice layer 942 is formed from the same material forming microfluidic passage forming layer 940. For example, in some implementations, both microfluidic passage forming layer 940 and ejection orifice layer 942 are formed from a photo imageable epoxy, such as SU8. In other implementations, microfluidic passage forming layer 940 may be formed from a first material while ejection orifice layer 942 is formed from a second material different than the first material.

Figure 13:
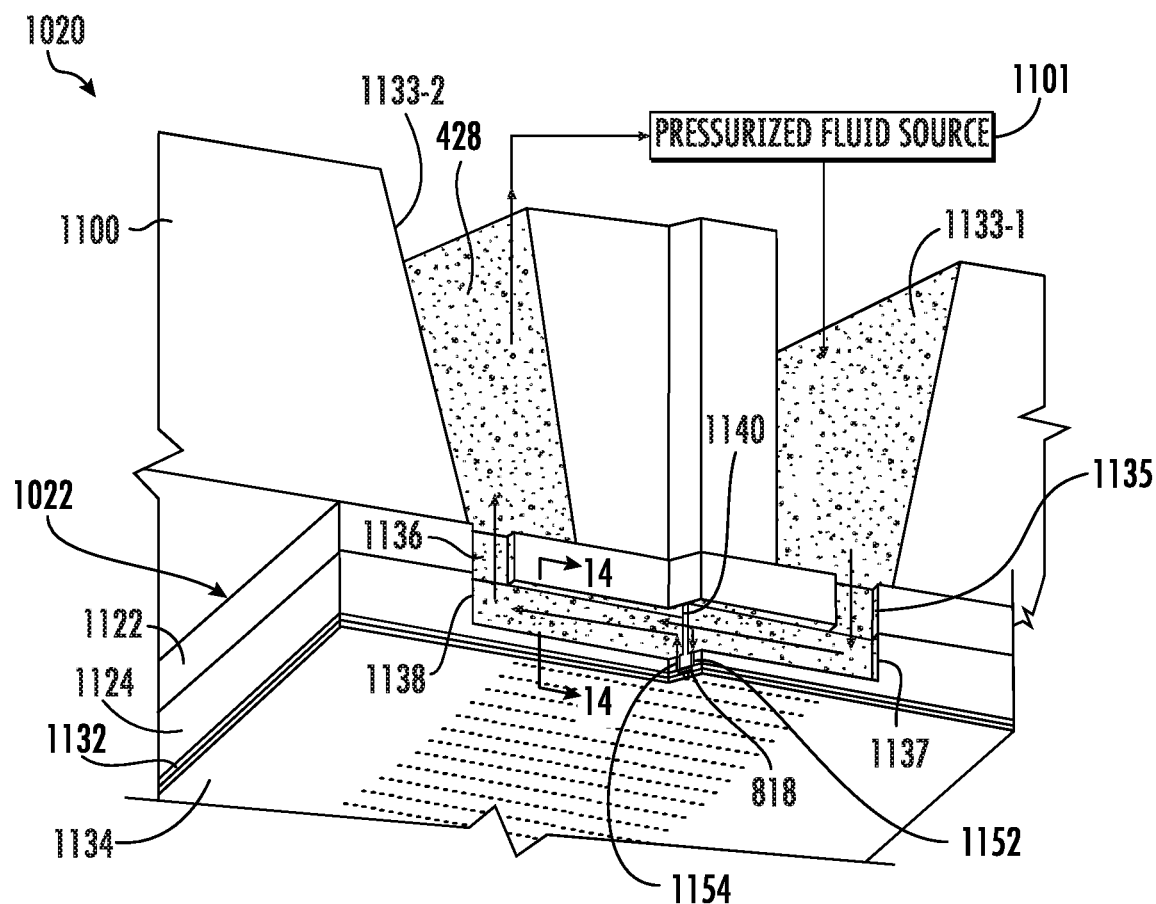
FIG. 13 is a perspective view illustrating portions of an example microfluidic die.
Figure 14:
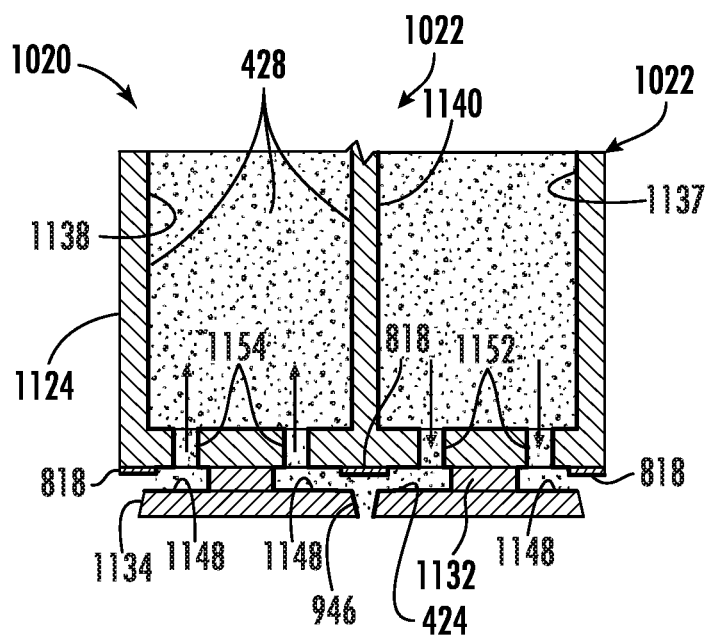
FIG. 14 is a sectional view of the example microfluidic die of FIG. 13 taken along line 14-14 of FIG. 13.

FIGS. 13 and 14 illustrate portions of an example microfluidic die 1020 in the form of a fluid ejection die. FIGS. 13 and 14 illustrate an example of a fluid ejection die including a protective coating similar to protective layers 28 and 428 described above. FIG. 13 is a perspective view illustrating a cross-section of portions the example microfluidic die 1020. FIG. 14 is an enlarged view of portions of the microfluidic die of FIG. 13. As with the above described microfluidic dies, microfluidic die 1020 has a protective layer 428 that provides its internal surfaces that may contact the fluid being ejected. Microfluidic die 1020 comprises fluid ejection head 1022 and protective layer 428. Head 1022 is joined to body 1100.

Body 1100 supports head 1022 while providing fan-out fluid passages 1133-1 and 1133-2 (collectively referred to as passages 1133). In some implementations, body 1100 is adhesively bonded to fluid ejection head 1022. In some implementations, body 1100 is molded about fluid ejection head 1022.

In the example illustrated, passage 1133-1 receives fluid from a pressurized fluid source 1101. Fluid passage 1133-2 directs fluid back to the pressurized fluid source 1101 for recirculation. In one implementation, body 1100 comprises a single unitary polymeric body is formed from an epoxy mold compound. In other implementations, body 1100 may be formed from other polymers. In one implementation, body 1100 is molded to form fan-out fluid passages 1133. In other implementations, body 1100 may be formed from other materials.

Head 1022 comprises layer 1122, layer 1124, thermal resistors 818, layer 1132 and layer 1134. Layer 1122 comprises a layer of material extending between body 1100 and layer 1124. Layer 1122 forms a port 1135 for fluid passage 1133-1 and a port 1136 for fluid passage 1133-2. In one implementation, port 1135 and port 1136 comprise fluid holes. In another implementation, port 1135 and port 1136 comprise slots or channels.

Layer 1124 comprises a layer or multiple layers of material forming inlet channel 1137 and outlet channel 1138. Inlet channel 1137 extends within layer 1124 from port 1135 of layer 1122. Outlet channel 1138 extends within layer 1124 from port 1136. Inlet channel 1137 and outlet channel 1138 are separated by an intervening rib 1140 of layer 1124. Rib 1140 supports thermal resistors 818, described above. Layer 1124 may additionally support electrically conductive traces, switches or other electronic componentry associated with the thermal resistors 818.

Although illustrated as two separate layers, in some implementations, layers 1122 and 1124 may comprise a single unitary or monolithic layer. In some implementations, both of layers 1122 and 1124 are formed from silicon. In other implementations, layers 1122 and 1124 may be formed from different materials. In some implementations, layer 1124 may be formed from silicon while layer 1122 is formed from other materials such as polymers, ceramics, glass, and the like. In some implementations, layer 1124 may be formed from materials other than silicon.

Layer 1132 comprises a layer or multiple layers of a material or materials joined to an underside of layer 1124 and forming recirculation passages 1148 (shown in FIG. 14). Recirculation passages 1148 comprise fluid passages that extend between and provide for fluid flow from channel 1137 to channel 1138, through microfluidic passage 424 (also referred to as a fluid ejection chamber) between an associated thermal resistor 818 and an ejection orifice 946 associated with the particular thermal resistor 818. In the example illustrated, each of recirculation passages 1148 and the formed microfluidic passage 424 has a ceiling provided by layer 1124, internal sides provided by layer 1132 and a floor provided by layer 1134.

Recirculation passages 1148 each receive fluid from channel 1137 through an inlet 1152 and discharge fluid to channel 1138 through an outlet 1154. In one implementation, each of inlets 1152 and outlets 1154 comprise fluid holes formed in layer 1124. In other implementations, inlets 1152 and outlets 1154 may be partially formed within layer 1132. In some implementations, inlets 1152 and outlets 1154 may each comprise multiple fluid holes or an array of fluid holes. In some implementations, inlets 1152 and outlets 1154 may comprise slots or channels.

Recirculation passages 1148 supply their respective thermal resistors 818 (which service fluid actuators) with fluid for ejection through the corresponding ejection orifice 946. Recirculation passages 1148 additionally circulate fluid across their respective thermal resistors 818 from channel 1137 to channel 1138 to reduce settling.

Layer 1134 comprises a layer of material or multiple layers of material joined to layer 1132 and forming ejection orifices 946. In some implementations, layer 1134 is formed from the same material as layer 1132. For example, in some implementations, layers 1132 and layer 1134 both formed from a photo-imageable epoxy. In some implementations, layer 1134 is formed from a different material as layer 1132. In some implementations, layers 1124, 1132 and 1134 are formed as a single fluid ejection die which is joined to body 1100 by layer 1122. In some implementations, layers 1122, 1124, 1132 and 1134 are formed as a single fluid ejection die which is otherwise joined to body 1100.

Protective layer 428 (shown with stippling) coats the interior surfaces of layer 1124 which may be vulnerable to corrosion, erosion, or other damage from the fluid to be ejected by microfluidic die 1020. As discussed above, in some implementations, layer 1124 may be formed from silicon, wherein the fluid to be ejected is corrosive or erosive to silicon. Protective layer 428 has a greater degree of robustness or a greater ability to withstand the corrosive and/or erosive nature of the fluid being ejected as compared to the silicon or other material forming layer 1124.

In the example illustrated, protective layer 428 coats the interior surface of each of passages 1133, port 1135, port 1136, channel 1137, 1138, inlets 1152, outlets 1154, recirculation passages 1148 (including the formed microfluidic passage 424) and the interior side surfaces of ejection orifices 946. In some implementations, each layer of protective layer 428 is any of the above described methods or combinations thereof. In other implementations, passages 1133 may omit protective layer 428. In other implementations, protective layer 428 may be formed on less than all of the illustrated surfaces. For example, in some implementations, protective layer 428 may simply extend on those portions of layer 1124 adjacent to microfluidic passage 424. In some implementations, protective layer 428 simply extends on those portions of layer 1124 adjacent to microfluidic passage 424 and on those surfaces of the thermal resistor 818 adjacent to microfluidic passage 424.

Although the present disclosure has been described with reference to example implementations, workers skilled in the art will recognize that changes may be made in form and detail without departing from the disclosure. For example, although different example implementations may have been described as including features providing various benefits, it is contemplated that the described features may be interchanged with one another or alternatively be combined with one another in the described example implementations or in other alternative implementations. Because the technology of the present disclosure is relatively complex, not all changes in the technology are foreseeable. The present disclosure described with reference to the example implementations and set forth in the following claims is manifestly intended to be as broad as possible. For example, unless specifically otherwise noted, the claims reciting a single particular element also encompass a plurality of such particular elements. The terms "first", "second", "third" and so on in the claims merely distinguish different elements and, unless otherwise stated, are not to be specifically associated with a particular order or particular numbering of elements in the disclosure.

What is claimed is:

1. A microfluidic die comprising:
   a microfluidic passage;
   a protective layer provided adjacent to internal surfaces of the microfluidic passage, the protective layer comprising:
   a protective nano-crystalline material; and
   a protective amorphous matrix encapsulating the protective nano-crystalline material.

2. The microfluidic die of claim 1, wherein the protective layer comprises a thin film having a thickness of no greater than 1 μm.

3. The microfluidic die of claim 2, where the protective layer comprises a thin film having a thickness of no greater than 500 nm.

4. The microfluidic die of claim 1, wherein the protective layer has a surface adjacent the microfluidic passage, the surface having a roughness of no greater than 10 nm.

5. The microfluidic die of claim 4, wherein the roughness of the surface adjacent the microfluidic passage is no greater than 5 nm.

6. The microfluidic die of claim 1, wherein the protective nano-crystalline material is selected from a group of materials consisting of Titanium Carbon Nitride (TiCN), Tantalum Carbon Nitride (TaCN), Niobium Carbon Nitride (NbCN), Titanium Boron Nitride (TiBN), Tantalum Boron Nitride (TaBN), Niobium Boron Nitride (NbCN), Titanium Tantalum Carbon Nitride, Titanium Tantalum Boron Nitride, titanium Niobium Carbon Nitride, Titanium Niobium Boron Nitride, Tantalum Niobium Carbon Nitride and Tantalum Niobium Boron Nitride.

7. The microfluidic die of claim 6, wherein the protective amorphous matrix is selected from a group of protective amorphous matrices consisting of silicon carbon (SiC) and silicon boron (SiB).

8. The microfluidic die of claim 6 further comprising a thermal resistor along the microfluidic passage, wherein the protective layer is sandwiched between the thermal resistor and the microfluidic passage.

9. The microfluidic die of claim 8 further comprising an ejection orifice extending from the microfluidic passage opposite the thermal resistor.

10. The microfluidic die of claim 1, wherein the protective layer is selectively patterned on internal surfaces of the microfluidic passage.

11. A method for forming a microfluidic die, the method comprising:
    providing a substrate;
    forming a protective layer upon the substrate, the protective layer comprising:
    a protective nano-crystalline material; and
    a protective amorphous matrix encapsulating the protective nano-crystalline material; and
    forming a microfluidic passage forming layer on the substrate to form the microfluidic passage along the protective layer.

12. The method of claim 11, wherein the microfluidic passage forming layer is formed on the protective layer.

13. The method of claim 11, wherein the protective layer comprises a thin film having a thickness of no greater than 1 μm.

14. The method of claim 13, wherein the protective layer has a roughness adjacent the microfluidic passage of no greater than 10 nm.

15. A fluid ejection die comprising:
    a substrate;
    a thermal resistor supported by the substrate;
    a fluid passage forming layer supported by the substrate to form a microfluidic passage opposite the thermal resistor; and
    a protective layer supported by the substrate between the microfluidic passage and the thermal resistor, the protective layer comprising:
    a protective nano-crystalline material; and
    a protective amorphous matrix encapsulating the protective nano-crystalline material.

16. The microfluidic die of claim 15, wherein the protective layer comprises a thin film having a thickness of no greater than 1 μm.

17. The microfluidic die of claim 15, wherein the protective layer has a surface adjacent the microfluidic passage, the surface having a roughness of no greater than 10 nm.

18. The microfluidic die of claim 15, wherein the protective nano-crystalline material is selected from a group of materials consisting of Titanium Carbon Nitride (TiCN), Tantalum Carbon Nitride (TaCN), Niobium Carbon Nitride (NbCN), Titanium Boron Nitride (TiBN), Tantalum Boron Nitride (TaBN), Niobium Boron Nitride (NbCN), Titanium Tantalum Carbon Nitride, Titanium Tantalum Boron Nitride, titanium Niobium Carbon Nitride, Titanium Niobium Boron Nitride, Tantalum Niobium Carbon Nitride and Tantalum Niobium Boron Nitride.

19. The microfluidic die of claim 15 further comprising an ejection orifice extending from the microfluidic passage opposite the thermal resistor.

20. The microfluidic die of claim 15, wherein the protective layer is selectively patterned on internal surfaces of the microfluidic passage.

* * * * *